United States Patent
Carr et al.

(10) Patent No.: US 6,696,352 B1
(45) Date of Patent: Feb. 24, 2004

(54) METHOD OF MANUFACTURE OF A MULTI-LAYERED SUBSTRATE WITH A THIN SINGLE CRYSTALLINE LAYER AND A VERSATILE SACRIFICIAL LAYER

(75) Inventors: William Carr, Montclair, NJ (US); Alexander Usenko, Murray Hill, NJ (US)

(73) Assignee: Silicon Wafer Technologies, Inc.

( * ) Notice: Subject to any disclaimer, the term of this patent is extended or adjusted under 35 U.S.C. 154(b) by 0 days.

(21) Appl. No.: 10/202,566

(22) Filed: Jul. 24, 2002

Related U.S. Application Data
(60) Provisional application No. 60/318,586, filed on Sep. 11, 2001.

(51) Int. Cl.⁷ .......................... H01L 21/30; H01L 21/46
(52) U.S. Cl. ..................................................... 438/458
(58) Field of Search ................. 438/455, 458, 438/33

(56) References Cited

U.S. PATENT DOCUMENTS

| | | | |
|---|---|---|---|
| 5,250,460 A | * 10/1993 | Yamagata et al. | ............ 437/62 |
| 5,374,564 A | 12/1994 | Bruel | |
| 5,877,070 A | * 3/1999 | Goesele et al. | ............ 438/458 |
| 6,060,336 A | 5/2000 | Wan | |
| 6,352,909 B1 | 3/2002 | Usenko | |
| 6,423,614 B1 | * 7/2002 | Doyle | ........................ 438/458 |
| 6,521,511 B1 | * 2/2003 | Inoue et al. | ................ 438/458 |

OTHER PUBLICATIONS

Huey–Chiang Liou, Evan Dehate, Jerry Duel, And Fred Dall, "Curing Study of Hydrogen Silsesquioxane Under H2/N2 Ambient", Mat. Res. Soc. Symp. Proc. vol. 612. Paper D5.12.1.

* cited by examiner

Primary Examiner—Carl Whitehead, Jr.
Assistant Examiner—David S Blum

(57) ABSTRACT

A process for producing a multilayered substrate. In a first step, an adhesive layer is applied to a surface of a support substrate. Then a device substrate is placed into contact with the adhesive surface. Then the adhesive is cured. Then the device substrate is thinned. The device substrate has a hydrogen trap layer inside. The trap layer is formed by ion implantation through a face surface of the device substrate. The adhesive is chosen from compounds that release hydrogen upon curing. Thinning of the device substrate is performed by cleavage along a fragile layer of hydrogen microbubbles. The microbubble layer is formed through gettering of hydrogen released from the adhesive layer upon curing onto the trap layer and evolving the trapped hydrogen into the microbubbles. The substrates are preferably silicon single crystalline wafers and the adhesive is preferably hydrogen-silsesquioxane. The process is preferentially used to manufacture silicon-on-adhesive wafers for microelectromechanical systems, multilayer CMOS, and optoelectronic applications. The layered wafers have one or more thin single crystalline device layers and one or more sacrificial/spacer layer.

8 Claims, 4 Drawing Sheets

METHOD OF MANUFACTURE OF A MULTI-LAYERED SUBSTRATE WITH A THIN SINGLE CRYSTALLINE LAYER AND A VERSATILE SACRIFICIAL LAYER

STATEMENT OF RELATED CASES

This application claims priority of provisional patent application serial No. 60/318,586, filed Sep. 11, 2001 and entitled "Method of Manufacture of a Multi-Layered Substrate with a Thin Single Crystalline Layer and a Versatile Sacrificial Layer", which is incorporated by reference herein.

FIELD OF THE INVENTION

The present invention relates generally to methods of producing of layered wafers with support, sacrificial and device layers. More particularly, the present invention relates to fabrication methods for wafers with a handle silicon wafer, polymeric intermediate layer and thin single crystalline silicon device layer. The handle and the device wafers may contain preformed semiconductor, optoelectronics or microelectromechanical (MEMS) devices.

BACKGROUND OF THE INVENTION

The use of layered initial substrates instead of bulk initial substrates is often advantageous to semiconductor manufacturing. Layered initial substrates are widely used in microelectronics, MEMS, and optoelectronics applications. Microelectronics uses (1) silicon-on-insulator (SOI), (2) silicon-on-sapphire, and (3) epitaxial types of the initial layered substrates. MEMS use SOI, silicon-on-adhesive, polysilicon-on-insulator, silicon-on-glass, and other types of initial layered substrates. The most useful are 3-layer structures with (1) top device layer, (2) middle sacrificial/spacer (for MEMS), or dielectric (for integrated circuits) layer, and (3) bottom support layer.

In previous art there is known a method of making silicon-on-adhesive wafers. According to Wan in U.S. Pat. No. 6,060,336 the device wafer 103 in FIG. 1 is bonded to a substrate wafer 101 with an organic adhesive layer 102. The wafer assembly consisting of members 101, 102, and 103 undergo for curing of the adhesive 102. After said curing the assembly consists of device wafer 103, substrate wafer 101, and cured adhesive layer 104. The device wafer 103 is usually thinned by polishing or other means. After the thinning the assembly consists of substrate wafer 101, cured adhesive 104, and device layer 105. The cured adhesive layer 104 serves as support and spacer 107. The remainder of the organic adhesive layer 109 serves as a sacrificial layer, which is removed by a dry etch means. Said device wafer is patterned 106, 108, 110 to form part of a MEMS device. An adhesive layer is very convenient for MEMS manufacturing as a sacrificial layer. It (1) can be made adequately thick or thin, (2) can be etched away with high selectivity to silicon and to silicon dioxide, (3) does not require etchants (such as KOH) that can poison semifinished signal conditioning circuits (CMOS) integrated on the same silicon die with micromechanics, and is (4) highly tolerant to silicon wafer surface roughness and particle contamination.

Disadvantages of Wan's process are as follows:

The minimum achievable thickness of the top single crystalline layer is limited to about 5 to 10 microns with the etchback technique disclosed. Further etchback to get a thinner layer give rise to thickness non-uniformity of the thinned layer and subsequent yield drop for the finished MEMS devices. The minimum achievable thickness also limits a scaling down of the micromechanical part of the MEMS. The scaling down limit, in turn, limits cost, the achievable integration level, and functional capabilities of final MEMS.

The suspended micromechnical members cannot be single-chip integrated with signal conditioning circuitry (CMOS). Single-chip integration means here that interconnections between micromechanical and microelectronic parts are made by deposition and patterning of a conductive layer (aluminum, polysilicon, etc.). Due to Wan, the signal conditioning circuits are made inside the bonded wafer pair and electrically connected to the suspended micromechanics with wires. This multichip structure prevents a batch processing with subsequent limitations on cost, scaling down, applicability to system-on-a-chip concept, etc.

Bubbles in the adhesive layer. Wan teaches to add solvents to the adhesive before applying to adjust the viscosity of the adhesive. The adhesive with the solvent are placed in between two wafers and cured. The solvent does not have a path to escape from the adhesive layer by evaporation and thus unwanted bubbles are formed.

In previous art there is a process for making SOI wafers. According to U.S. Pat. No. 5,374,564 by Bruel schematically illustrated on FIG. 2, thin monocrystalline semiconductor material films are prepared, by subjecting a semiconductor material wafer having a planar face 4 to the following process steps: a first step of implantation by bombardment of the face 4 of the said wafer 6 (which might have a thin silicon dioxide layer 10) by means of ions 2 creating in the volume of said wafer a layer of gaseous microbubbles 3 defining in the volume of said wafer a lower region 1 constituting the mass of the substrate and an upper region 5 constituting the thin film, a second stage of intimately contacting the planar face of said wafer with a stiffener 7 constituted by at least one rigid material layer, a third stage of heat treating the assembly of said wafer and said stiffener at a temperature above that at which the ion bombardment was carried out and sufficient to create by a crystalline rearrangement effect in said wafer and a pressure effect in the said microbubbles, a separation 8 between the thin film and the mass of the substrate. The finished structure of Bruel's process is a silicon-on-insulator (SOI) wafer 7. MEMS devices can be fabricated on those wafers. SOI substrates fabricated by Bruel's process are very suitable for integrated circuits manufacturing. In some cases, the Bruel's SOI are very suitable for MEMS manufacturing because of thin and high quality top single-crystalline silicon layer.

Disadvantages of the Bruel process include the following:

Thickness of a silicon dioxide layer is too small for many of MEMS applications. The thickness cannot exceed about 1.5 micrometers for conventional silicon dioxide grown or deposited on silicon. The silicon dioxide serves as a sacrificial layer to form spacer for suspended micromechanics. For many micromechanical applications bigger spacers are needed.

It is difficult to integrate suspended micromechanical members with CMOS signal conditioning circuits using a single SOI initial substrate. If the micromechanics is fabricated first, then the suspended parts cannot survive high temperature steps required in subsequent CMOS manufacturing. If the CMOS is fabricated first, then CMOS cannot survive selective etch step (using typically KOH) required in subsequent release process to form MEMS.

Initial SOI substrates are expensive (5 to 10 times more expensive than similar size bulk silicon substrates) thus making difficult an economically profitable manufacturing of the final MEMS.

Silicon dioxide is not a preferred sacrificial layer for many MEMS applications.

The direct wafer bonding step imposes very strict requirements on the wafer surface roughness and particle contamination on the wafer surfaces to be mated. It requires more expensive process equipment with a given process yield level.

In previous art there is known a process Usenko, U.S. Pat. No. 6,352,909 for liftoff of a layer from a substrate. In Usenko process a layer is lifted off from a silicon wafer to further form a silicon-on-insulator (SOI) sandwich structure, wherein a separative interlayer comprises a thin quasi-continuous gaseous layer and said interlayer is obtained by gettering monatomic hydrogen into a preformed buried defect-rich layer preferably created by implantation and evolving of hydrogen-filled getter layer into the quasi-continuous gaseous layer by thermal treatment means.

The Usenko process allows fabricating lower cost SOI as compared with the Bruel process. However, the rest of disadvantages as concerning to further MEMS manufacturing remain.

A combination of Bruel's process giving a thin top silicon layer with the Wan's process giving versatile sacrificial layer would be advantageous to the art. However, the processes cannot be directly combined. Bruel's process requires 500° C. annealing to evolve hydrogen-rich layer into a microbubble layer thus enabling cleavage to release the layer from the substrate. This temperature is higher then the survival temperature of known polymeric adhesives. The annealing temperature can be decreased somewhat in the Bruel process provided a higher dose of implanted hydrogen used. However, increasing of the dose causes blistering of wafer surface under implantation. The ion beam heats the wafer during implantation. The heating is usually non-uniform because of localized cooling paths from the wafer to the wafer fixture inside of the vacuumed implantation chamber. Implanted hydrogen evolves into bubbles at hot spots thus causing the undesirable blistering of as-implanted wafers. On the other hand the use of a low ion beam current to suppress blistering causes unacceptable long implant times.

It would be advantageous to the art to have a process for the fabrication of a layered substrate for MEMS manufacturing with a thin top single crystalline Si layer and a versatile (easy etchable and thickness-controllable) sacrificial layer.

SUMMARY OF THE INVENTION

It is therefore an object of the present invention to provide an improved method of manufacture of a layered initial substrate to be used in microelectronics MEMS manufacturing that is characterized by thin top single crystalline silicon layer and versatile middle adhesive layer.

A process in accordance with the present invention provides fabrication of a layered initial substrate to be used in microelectronics and MEMS manufacturing. A first silicon wafer contains a gettering layer for hydrogen. The gettering layer for hydrogen inside of said first wafer is preferably formed by ion implantation through a face surface of said wafer. The gettering layer capacity for hydrogen exceeds $10^{17}$ cm$^{-2}$ provided by implantation conditions. An adhesive layer is applied to the implanted face surface of said wafer. A second wafer is mated to the said adhesive layer thus creating a wafer-adhesive-wafer sandwich assembly. The material for said adhesive layer is chosen from compounds that release atomic hydrogen upon curing. The said compound is preferably a hydrogen-silsesquioxane. Said assembly is processed to cure the adhesive. Said curing comprises heating, or ionizing irradiation depending on the specific adhesive used. The temperature under said curing is in a range of 200° C. 500° C. Hydrogen is released from the adhesive under curing and diffuses into both wafers. In said first wafer the diffusing hydrogen is trapped onto the getter layer thus forming a hydrogen-rich layer. Said assembly is thermally processed at temperatures ranging from 300° C. to 600° C. to evolve the hydrogen-rich layer into hydrogen microbubble layer. Then said assembly is separated along said hydrogen microbubble layer to create the desired layered substrate.

DETAILED DESCRIPTION

A process in accordance with the present invention provides fabrication of a layered initial substrate to be used in semiconductor related manufacturing. A preferred embodiment of silicon-on-adhesive wafer is fabricated in accordance with the present teachings.

Figure 1:
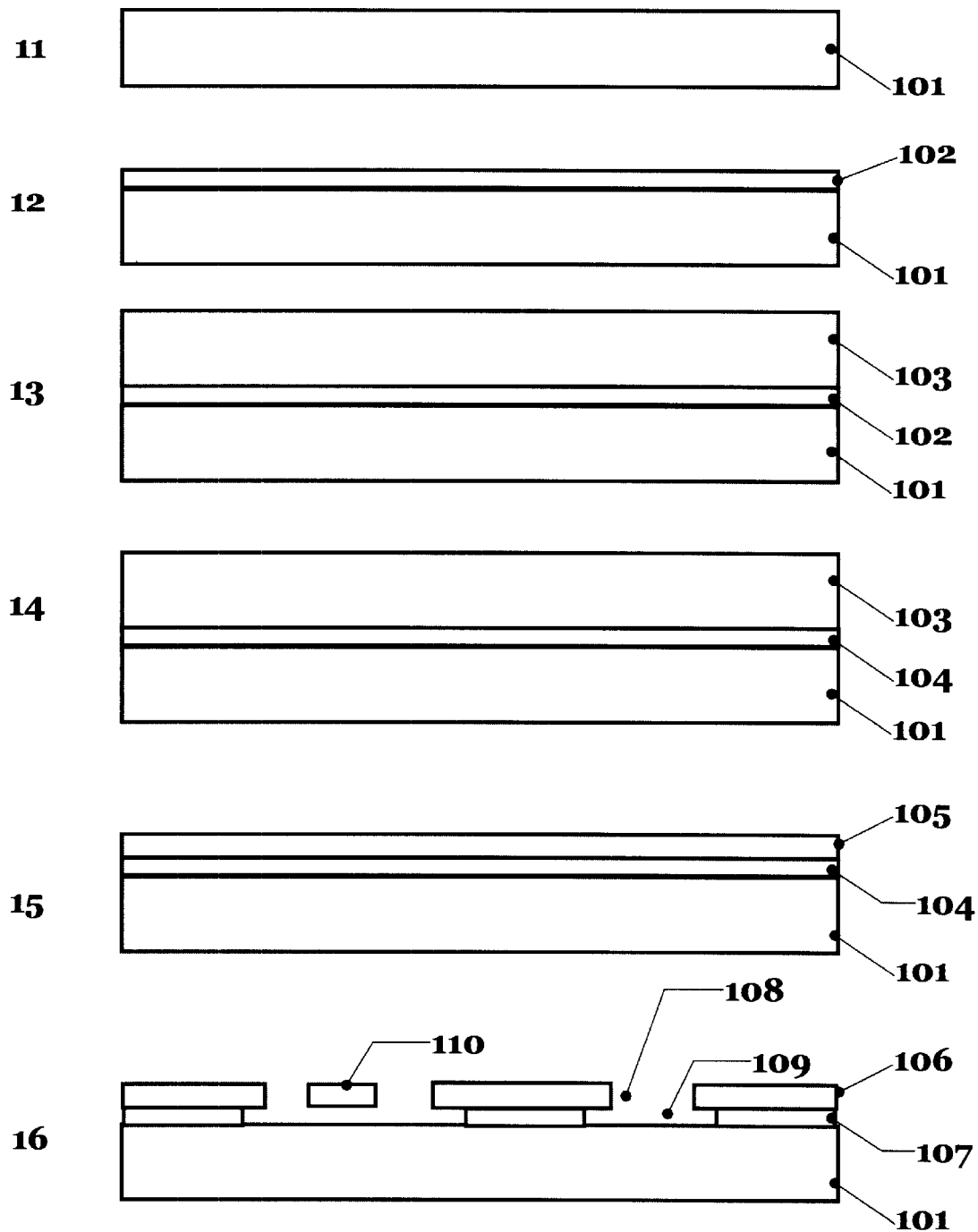
FIG. 1 illustrates prior art process of making silicon-on-adhesive wafers.
Figure 2:
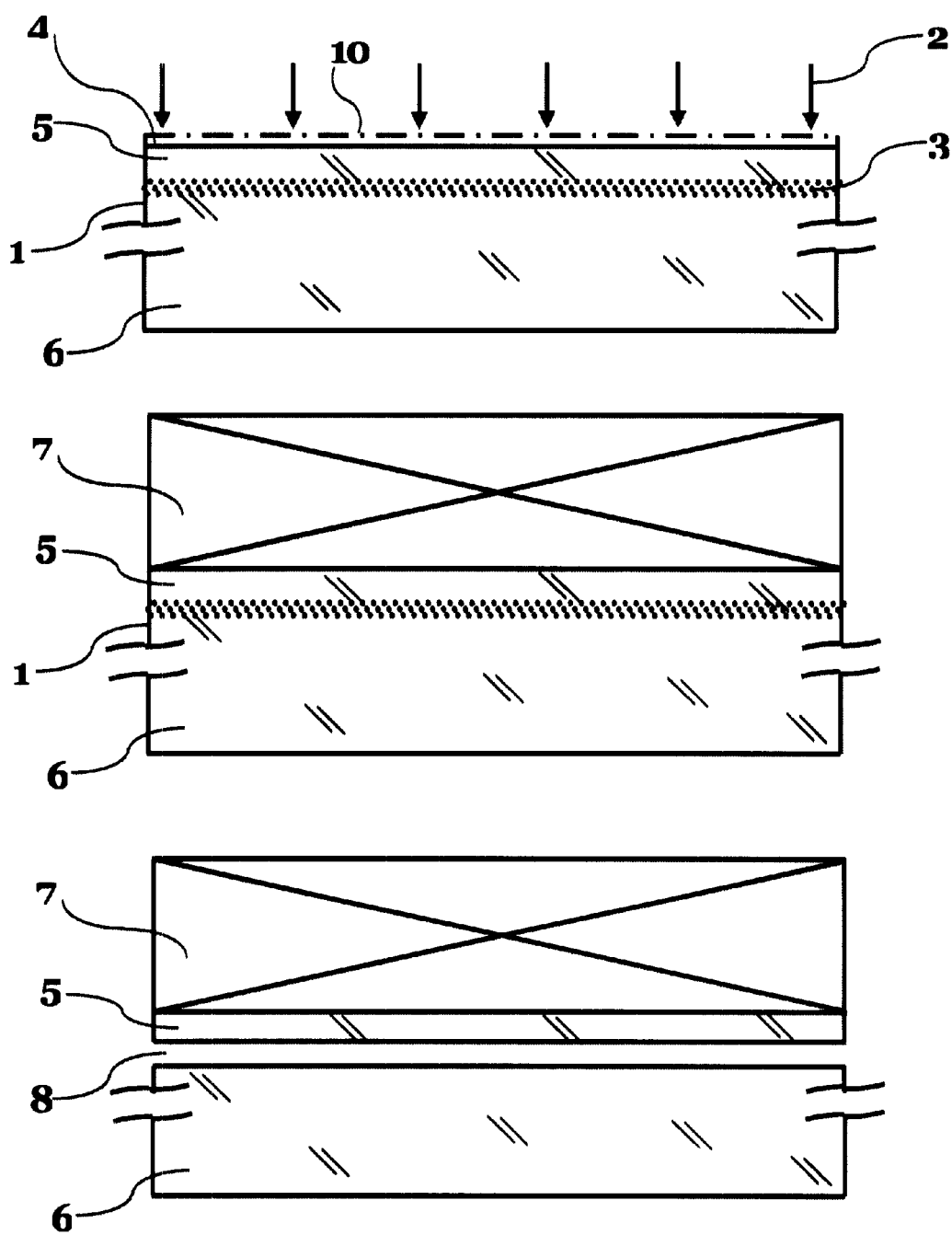
FIG. 2 illustrates prior art process of making silicon-on-insulator wafers.
Figure 3:
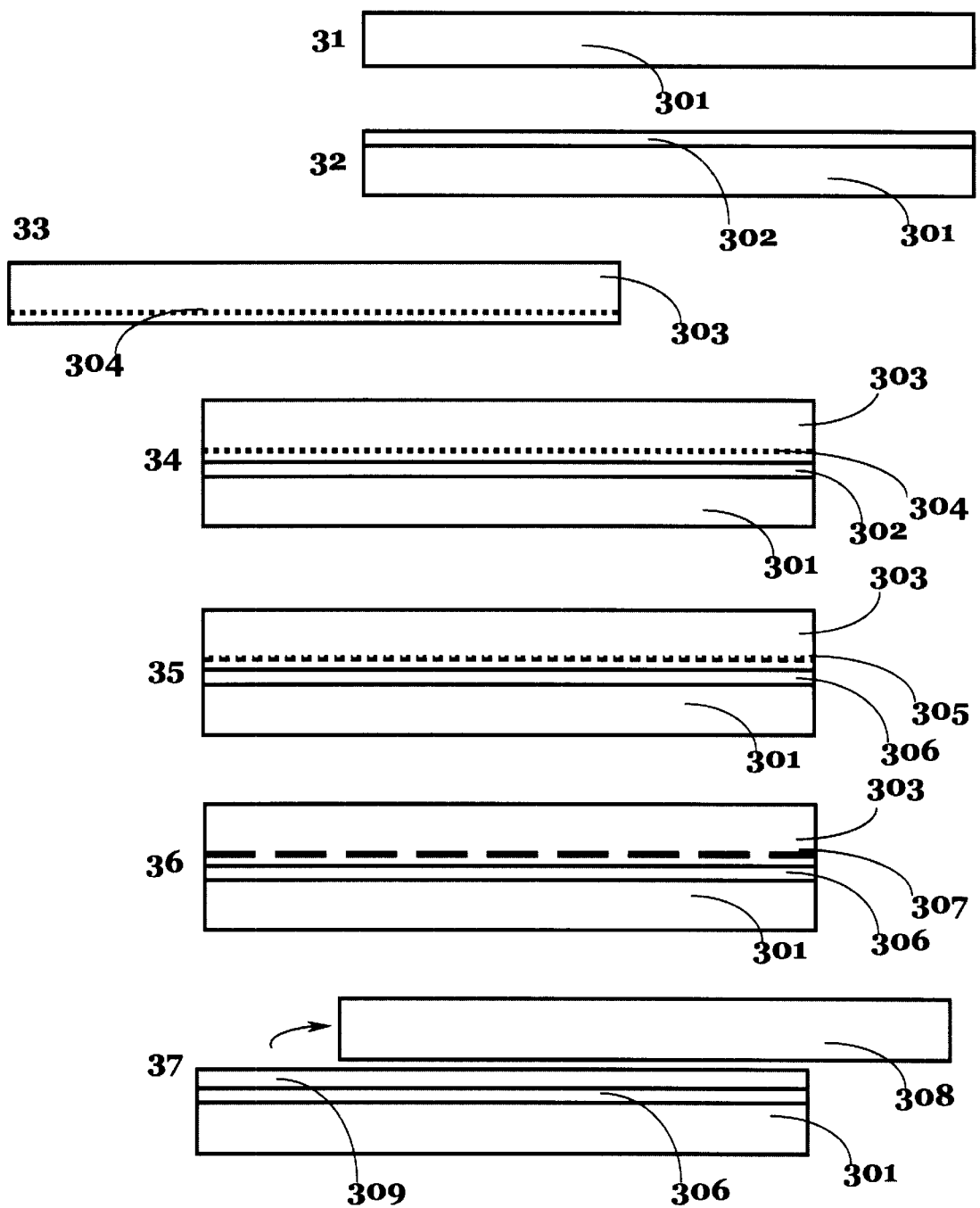
FIG. 3 depicts a process of making silicon-on-adhesive wafers due to present teaching.

According to operation 31 of illustrative method FIG. 3 an initial substrate silicon wafer 301 is provided. The wafer 301 can be a processed CMOS wafer if the final product combines single-crystal micromechanics on-die integrated with CMOS signal conditioning circuitry. The processed wafers usually present a non-planar surface relief. Otherwise the wafer 301 can be a bare silicon wafer. Wafer 301 provides the primary mechanical function of support the microstructure to be formed on its top. A noncleavable substrate can also be glass wafer for optoelectronics or other applications, or it can be a wafer with semiprocessed CMOS. The wafer material choice is restricted by temperature since the highest temperature to be used during the inventive process is 300° C. to 400° C. at the step of evolving gettered hydrogen into hydrogen platelets and then microbubbles. Silicon wafer is preferable if compatibility with standard microelectronics equipment is important.

According to next operation 32 of illustrative method FIG. 3 said substrate wafer 301 is covered with a layer of adhesive 302. The adhesive is preferably applied by spin-on means. The thickness of the layer depends on the adhesive viscosity and on spinning speed. One skilled in the art can choose the proper combination of viscosity and speed to obtain a desired thickness of the layer. Typical thicknesses are in a range between 0.1 and 10 micrometers. To obtain a thickness of more than 1 micrometer a repetitive spin operations are usually used. One preferred adhesive is a hydrogen-silsesquoxane (HSQ) where each spin operation creates typically 0.5 to 1 micron thick layers. If the wafer 301 is a CMOS processed wafer, it is preferable to use 1 micrometer or thicker layer to planarize the surface. The thickness of the hydrogen-silsesquioxane (HSQ) should exceed the relief size of the CMOS wafer and can be properly chosen by one skilled in the art. The maximum temperature of further processing is often limited by survivability of the CMOS wafer. For, example, if the CMOS wafer has aluminum interconnections, then the temperature of subsequent processes is limited to 470° C.

Silsesquioxanes are a class of silicon-based polymers. They are used in microelectronics as low-dielectric constant insulator materials. The general chemical composition of HSQ before curing is $(HSiO_{3/2})_n$. Under annealing HSQ structure changes due to the loss of hydrogen as the annealing temperature increases above a critical value for given silsesquioxane. For example, poly(hydrido silsesquioxane) (PHSQ) changes from cage to ladder type structure at 300° C. (releasing hydrogen) while poly(methyl silsesquioxane) (PMSQ) remains stable to 450° C. Under further annealing HSQ decomposition continues and a final stage at temperatures over 600° C. it is completely transformed into $SiO_2$, see, for example, H.-C. Liou, E. Dehate, J. Duel, F. Dall, "Curing Study Of Hydrogen Silsesquioxane Under $H_2/N_2$ Ambient", Mat. Res. Soc. Symp. Proc. Vol. 612. Paper D5.12.1. In the present invention the HSQ after annealing forms the desired adhesive layer bonding two wafers together.

Silicon-based polymers are inorganic polymeric compounds containing at least 3 types of elements (in addition, some of those compounds can contain another elements): silicon, oxygen, and hydrogen. When an initial monomer is polymerized (usually upon heating), there are no leftovers, so no gas is released. Upon further heating the silicon-based polymer decomposes and the final products are the more thermally stable compounds, which are silicon dioxide and hydrogen, or silicon dioxide, hydrogen, and water, depending on either silicon/oxygen ration is less than ½, or higher than ½. Hydrogen is a typical byproduct of reaction of thermal decomposition of silicon-based polymers. Therefore, many of silicon-based organic adhesives can be used for purposes of present teaching.

In step 32 1.2 micrometer thick HSQ films were prepared by spin-coating Dow Corning FOx®-16 solution onto Si wafers in a single coat. The FOx®-16 contain methyl isobutyl ketone as a solvent that volatize rapidly from the resin leaving a planar surface. Other solvents as methyl siloxane can be used for the same purpose.

According to next the operation 33 of illustrative method FIG. 3 a device wafer 303 is provided. In this embodiment a 530 micrometer-thick single crystalline silicon substrates with (100) crystallographic surface orientation is used. A 50 nanometer thick thermal oxide covers the surface of the silicon substrate. A trap inducing implantation into the surface is performed with singly and positively charged silicon ions at 180 keV with a dose of $5 \times 10^{14}$ $cm^{-2}$. The silicon ions transform into atoms by catching an electron upon reaching a surface of a target forms an implanted silicon depth concentration distribution with a maximum at a depth $R_p$ of approximately 0.5 micrometers. Maximum concentration of displaced atoms occurs at a depth of ½ $R_p$=0.25 micrometers. The wafer temperature is maintained near room temperature during implantation. The wafer is preferably kept at lowest possible temperature during implantation to maximize the number of traps created for hydrogen. An implantation energy is chosen high enough (tens to hundreds keV) to ensure that ions penetrate deep enough, so the surface of the wafer is not amorphized. A buried amorphous layer 304 is created as a result of the implantation.

The trap-inducing step should generate at least $10^{17}$ $cm^{-2}$ silicon broken bonds so that hydrogen can be inserted in the amount exceeding the level needed to form a continuous platelet layer. The trap-inducing step should create a trap density approximately equal to the number of atoms in two monatomic layers of the silicon lattice (approximately $10^{16}$ $cm^{-2}$). A convenient way to create a buried trap layer is to use ion implantation. To create the trap an atom of lattice is displaced from its regular position in the lattice thus forming a vacancy and interstitial atom (a Frenkel pair). Each silicon atom has four bonds so a single displacement forms 8 silicon broken bonds (4 of them linked to an interstitial silicon atom and 4 others linked to 4 atoms surrounding a vacancy in silicon lattice). Each implanted ion can generate up to $E_{ion}/E_{bond}$=N displacements in a target, where $E_{ion}$ is the energy of bombarding ion, and $E_{bond}$ is an energy that is needed to remove an atom of target from its place in the lattice. The typical energy of bombarding ions $E_{ion}$ is 30–300 keV. The energy $E_{bond}$ for displacing or removing a silicon atom from the silicon lattice is 12 eV. Thus each bombarding ion can generate up to about $10^4$ displacements. Accordingly, to generate about $10^{17}$ $cm^{-2}$ broken bonds an implantation dose exceeding $10^{13}$ $cm^{-2}$ is needed. This is a dose that is about 4 orders of magnitude lower than the dose of hydrogen implantation needed in the Bruel process (U.S. Pat. No. 5,374,564). Since implantation based on the Bruel process with a dose of over $10^{17}$ $cm^{-2}$ is difficult to perform without blistering of the wafer surface during implantation, the process due to the present invention allows to make a silicon-on-adhesive substrate.

The dose needed to form an effective trap layer for hydrogen is in the range of $10^{13}$ to $10^{15}$ $cm^{-2}$ depending upon specie, temperature, and energy. This dose is much lower than the dose needed for the Bruel process. Choice of the optimal dose is explained in the following. While a bombarding ion makes the displacements, some of the displaced atoms return to their previous places in lattice. Thus some of the displacements self-anneal or annihilate. In practice, 90 to 99% of the displacements do annihilate, depending mostly on the target temperature. At low temperature (liquid nitrogen) self-annealing is suppressed, and at higher temperature the self-annealing effect increases. That is why low temperature implantation is preferred for use in the present invention in order to create maximum number of hydrogen traps.

Figure 4:
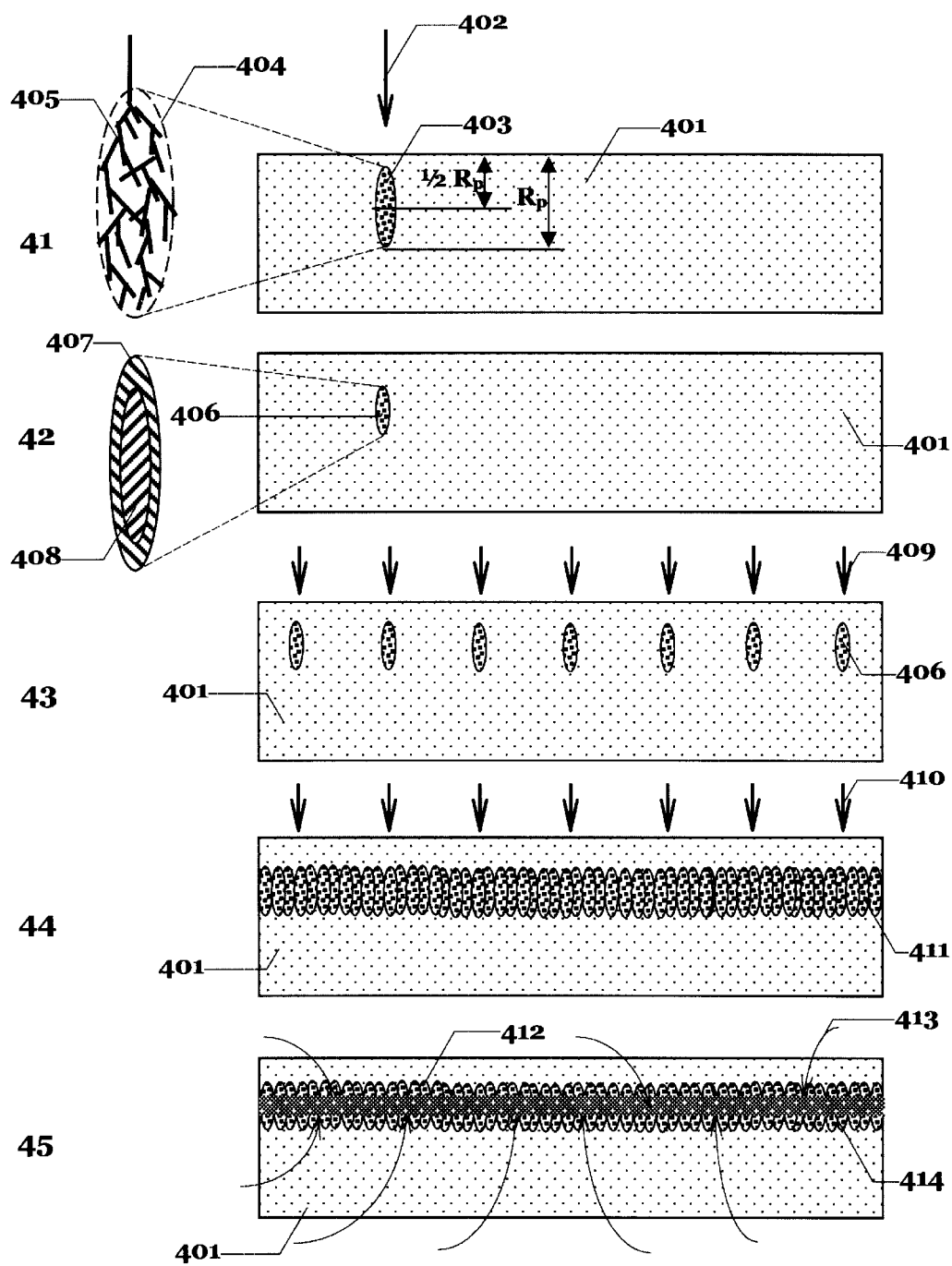
FIG. 4 illustrates process of making a getter layer for hydrogen and process of trapping hydrogen onto the getter.

While a bombarding ion is penetrating and transferring energy to the silicon lattice, the displacement cascade 3 proceeds with a cigar shape oriented along the ion trajectory in FIG. 4A. The displacement cascade is also known as the disordered region. The disordered region contains an inner vacancy-rich region 8 and an outer interstitial-rich region 7 in FIG. 4B. The vacancy-rich region serves as an effective hydrogen trap while the interstitial-rich region does not trap the hydrogen. Monatomic hydrogen diffuses through the interstitial-rich outer region and is then trapped in the inner part of the displacement cascade. The interstitial-rich layer has a moderate (~0.7 eV) potential barrier for hydrogen. The diffusion coefficient of hydrogen through outer part of the displacement region is low. This diffusion coefficient is about equal to diffusion coefficient of hydrogen in amorphous silicon. The diffusion coefficient of monatomic hydrogen $H^+$ in crystalline siliconis $9.7 \times 10^{-3}$exp(−0.48 eV/kT) from Van Wieringen and Warmolz. The diffusion coefficient for monatomic hydrogen in the interstitial-rich region is about 4 orders of magnitude lower. The trapping of hydrogen onto vacancy-facing silicon broken bonds is dependent on the implantation dose. With the increase in the implant dose, the individual cigar-shaped disordered regions 406 become spaced more densely (FIG. 4 step 43), next they overlap, and finally they form a continuous amorphized layer 411 (FIG. 4 step 44).

A further increasing in the implantation dose increases the thickness of the amorphized layer 411 FIG. 4, step 44 and the upper boundary of the amorphized layer at some high dose level actually reaches the silicon surface. Widening of the amorphized layer is undesirable, because to effectively lift-off a layer the fracture plane should be created precisely planar and thin. Otherwise the platelets appear on different crystal planes which causes an increased surface roughness of the lifted-off layer. An amorphized layer of minimum thickness contains about $10^{18}$ $cm^{-2}$ hydrogen trap sites which is enough for further continuous platelet layer formation. This minimum thickness is typically less than 0.1 micrometer and is approximately equal to the inner region 408 of the disordered region of FIG. 4 step 42. Going beyond the amorphization threshold is not desirable. There is an optimum implant density which results in an atomically flat surface of the lifted-off layer. The optimum dose of ion implantation is slightly larger than the amorphization threshold. This optimum dose can be calculated for particular cases using previous art described in, for example "Handbook of Ion Implantation Technology" ed. by J. F. Ziegler, North-Holland, 1992.

FIG. 4 schematically illustrates phenomena involved in the process of collecting hydrogen into the trap layer within the silicon wafer. Accordingly, in FIG. 4 step 41 silicon wafer 401 is implanted with bombarding ions 2 that penetrate the top surface of the silicon wafer 1 and form a disordered (amorphized) region 403. Region 403 is shown enlarged as 404. The disordered region 3 is formed due to numerical displacements of silicon atoms. Recoil atom trajectories 405 are shown as displacements. Atoms in the disordered region move into thermally stable positions at a given temperature. The disordered region 403 decreases in size due to the self annealing process as is shown on FIG. 4 step 42. The transformed disordered region 406 of FIG. 4 step 42 consists of outer region 407 which is interstitial-rich silicon and an inner part 408 which is vacancy-rich silicon.

The amorphization threshold depends on the implantation dose, the ion mass, the ion energy, and the substrate temperature. The critical phenomena controlling amorphization is self-annealing. In addition to the above list of parameters, self-annealing also depends on the depth of the amorphous-crystalline interface (the closer to the surface, the more effective). To survive, a disordered region formed by a displacement cascade should exceed a threshold size. At room temperature light ions (boron, hydrogen) make small cascades, that self-anneal without producing disordered regions. Therefore silicon cannot be amorphized with light ions at room temperature. However, at lower temperatures light ions can amorphize silicon. Medium ions (silicon) do amorphize silicon at room temperature when dose exceeds $10^{15}$ $cm^{-2}$. Heavy ions (krypton, antimony) amorphize silicon at room temperature with dose as low as $\sim 10^{14}$ $cm^{-2}$.

With heavy ion implants such as argon the buried amorphized layer begins not deeper than 0.1 micrometer even at high ~300 keV energy. Layers thinner than about 0.1 micrometer using heavy ion implants can be cleaved. For facilitating lift-off of layers of less than 0.1 micrometer thickness heavy ions are preferable. Medium mass ions such as germanium allow layer up to 0.5–0.8 micrometers thickness to be lifted-off. For the manufacture of SOI wafers in mainstream state of the art CMOS integrated circuits with feature size of 0.18 micrometers, medium mass ions are preferable for creating the amorphized region. The lightest ions (protons) permit lift-off of layers up to 10 micrometers thick for 1.6 MeV protons implanted at a dose of $10^{14}$ $cm^{-2}$ and with the substrate cooled during the implantation step to liquid nitrogen temperature. Use of the lightest ions is preferable for fabricating thick top layer SOI for applications such as MEMS, power transistors and p-i-n diodes. An additional advantage of using the lightest ions is that blistering phenomena is suppressed. Accordingly, thick layer can be lifted off without using a stiffener wafer.

It is generally preferable that the ion implant specie used to form the trap layer does not contaminate or dope the silicon. From this consideration, the best implants are silicon ions. However, implanting of an electrically inactive species including helium and argon is also appropriate.

The implanted specie is mostly deposited around the projected range depth $R_p$, while cleaving plane proceeds close to $\frac{1}{2}R_p$ plane. Thus the majority of implanted ions are left in substrate side and are not retained in the in the cleaved layer. Accordingly, for processes that do not use repeated slicing of layers from the same substrate 301, contamination or doping with implanted specie is reduced.

According to next operation 34 of illustrative method FIG. 3 a device wafer 303 is is mated to an adhesive layer 302 coated onto support wafer 301 thus creating the wafer-adhesive-wafer assembly. The intimate contacting of the wafers is preferably performed with wafer alignment. To accomplish the bonding, wafers 301 and 303 are loaded into aligner of wafer bonding machine like EV-501 by EVGroup and aligned. The wafers then are next moved to the bonding chuck and contacted at temperature 90 to 140° C. An elevated temperature is preferable in order to melt the hydrogen silsesquioxane adhesive layer. If a different adhesive is used, one skilled in the art using manufacturer's technical notes on that adhesive can properly choose the temperature. A uniform pressure of about 0.01 Newton/$cm^2$ is applied of duration 1 to 10 minutes. The melted adhesive flows under pressure thus filling cavities and absorbing particles on the contacted surfaces. If an alignment is not required, the wafer contacting can be performed using a hotplate or similar nonexpensive apparatus. A void-free wafer assembly is formed at the end of operation 34.

In the next operation 35 of illustrative method FIG. 3 a cured adhesive layer 306 is formed. Hydrogen silsesquioxane is cured to a microporous amorphous film. After operation 34 the film 306 is cured in a standard quartz diffusion furnace at the curing temperature of the adhesive used. Atomic hydrogen is released from the hydrogen silsesquioxane under curing. Hydrogen has a high diffusivity in both the adhesive layer and in the silicon and thus it diffuses from the adhesive layer into silicon wafers without forming gaseous bubbles. The device wafer 303 contains a hydrogen trap 305 that getters the hydrogen until its saturation.

Alternatively the 35 comprises electron beam curing of the adhesive layer from non-cured form 304 to cured form 305. Organic polymers as bismaleimides or tertiary amines or polyimides are used in this case.

In the case of electron-beam irradiation, highly energetic electrons strike at or near the carbon-hydrogen bonds in target molecules, and give up enough energy to the molecules to break some of the bonds, releasing hydrogen, and leaving the molecules with excited carbon atoms (free radicals). When this process occurs at two adjacent molecules or nearby sites, excited carbon atoms can release excitation energy forming a chemical bond, known as a cross-link, between them. The dose of electron beam radiation absorbed by the target typically in the megarad range. Industrially, electron beam processing is performed using medium to high energy (2.5 to 10 MeV), high power (50+ kW) commercially-available accelerators equipped with a variety of material handling systems.

In process step 36 of illustrative method FIG. 3 the hydrogen-filled gettering layer 305 of operation 35 next evolves into a hydrogen microbubble layer 307. The operation 36 comprises a heat treatment at temperature 250 to 600° C. The temperature depends on amount of hydrogen collected in the layer 305 during operation 34. For lower amounts of hydrogen (about $10^{17}$ cm$^{-2}$ and less) a higher temperature 450 to 600° C. is required. For bigger amounts of hydrogen (more than $2 \times 10^{17}$ cm$^{-2}$) a lower temperature 250 to 450° C. is preferred. Operations 35 and 36 can be combined in a single annealing process. Typical thermal process duration is in a range from 1 to 100 minutes.

Alternatively the cleavage plane 307 can be obtained using high dose hydrogen implantation according to the teaching of Bruel.

In the next operation 37 of illustrative method FIG. 3 the assembly is separated into two pieces to obtain wafer 308 and a silicon-on-adhesive wafer 309. The assembly is separated along said hydrogen microbubble layer. Separation can be performed by convenient means as described for example, in the above-cited Bruel patent.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. A method of manufacture of a layered substrate with a bottom support substrate, versatile middle layer, and a top thin single crystalline layer, comprising the steps of:

providing a support substrate;

applying a layer of adhesive to said support substrate;

providing a donor substrate containing a layer of traps for hydrogen placing said donor substrate onto said adhesive;

curing said adhesive and thus simultaneously making said donor substrate cleavable separating said cleavable substrate thereby creating the layered substrate.

2. The method of claim 1 wherein said donor substrate comprises a silicon single crystalline wafer.

3. The method of claim 1 where the support substrate includes variously fabricated integrated circuits, microelectromechanical devices, light emitting structures, or other microstructures.

4. The method of claim 1 where the donor substrate is a semiconductor with the thin surface film containing variously fabricated integrated circuits, microelectromechanical devices, light emitting structures, or other microstructures.

5. The method of claim 1 wherein said donor substrate comprises silicon single crystalline wafer implanted with ions with dose in a range of $10^{14}$ to $5 \times 10^{15}$ cm$^{-2}$ to create a buried layer of hydrogen traps.

6. The method of claim 5 wherein said donor substrate is made cleavable by hydrogenating of said traps with hydrogen released by the adhesive layer during said curing step.

7. The method of claim 1 wherein said step of curing comprises heating to a temperature less than 350° C.

8. The method of claim 1 wherein the said adhesive comprise bismaleimide or tertiary amine or polyimide and said curing comprises electron beam irradiation.

* * * * *